United States Patent [19]

Tam et al.

[11] Patent Number: 4,805,149

[45] Date of Patent: Feb. 14, 1989

[54] DIGITAL MEMORY WITH RESET/PRESET CAPABILITIES

[75] Inventors: Aloysius Tam, Sunnyvale; Thomas S. Wong, San Jose; David Wang, Berkeley; David Naren, Cupertino, all of Calif.

[73] Assignee: Advanced Micro Devices, Inc., Sunnyvale, Calif.

[21] Appl. No.: 901,914

[22] Filed: Aug. 28, 1986

[51] Int. Cl.[4] ............................................. G11C 11/40
[52] U.S. Cl. .................................. 365/155; 365/218; 365/190; 357/44; 357/48
[58] Field of Search ............... 365/190, 155, 179, 189, 365/230, 218, 156, 95, 175; 357/40, 45, 47, 48, 42, 44

[56] References Cited

U.S. PATENT DOCUMENTS 4,701,883  10/1987  Wrathall et al. ................... 365/175

Primary Examiner—Stuart N. Hecker
Assistant Examiner—Glenn A. Gossage
Attorney, Agent, or Firm—Davis Chin; Paul L. Hickman; Paul L. Hickman

[57] ABSTRACT

A digital memory characterized by a plurality of memory cells arranged into a matrix having rows and columns; a row activation circuit for concurrently activating all of the rows of the matrix; and column activation means for concurrently applying either a reset signal or a preset signal to the columns of the matrix. The column activation circuit can include a plurality of digital switches coupled to reset and preset lines associated with each column of the matrix; and reset/preset logic which control the digital switches to selectively couple the reset and preset lines to a constant current source. A complementary, multi-emitter flip-flop memory cell is formed on a semiconductor substrate and includes "riser" portions.

1 Claim, 2 Drawing Sheets

DIGITAL MEMORY WITH RESET/PRESET CAPABILITIES

CROSS REFERENCE TO RELATED, COPENDING APPLICATION

A related, copending application of particular interest to the instant application is Ser. No. 06/835,078, filed 02/28/86 on behalf of Al Tam, now U.S. Pat. No. 4,740,971, entitled "Tag Buffer with Testing Capabilities", and assigned to the assignee of the instant application.

BACKGROUND OF THE INVENTION

1. Field of the Invention

This invention relates generally to digital memory, and more particularly to digital memory used in cache memory systems.

2. Description of the Related Art

A cache memory unit can be added to a computer system design to increase the speed and performance of the computer system. The cache memory unit serves as a user-transparent buffer between the central processing unit (CPU) and the main memory of the computer system. A cache memory unit typically includes expensive, high speed random access memory (RAM) which is relatively small in capacity compared to the capacity of the main memory. The cache RAM might, for example, be ten times faster and have one-tenth the capacity of the main memory. By storing frequently used data in the cache, the CPU can retrieve that data at high speed, boosting system performance.

A cache unit usually includes tag buffers, data buffers, and a cache controller. The data buffers store frequently used data for high speed retrieval by the CPU. The tag buffers are used to determine if the data needed by the CPU is in the cache data buffers, or in main memory. The cache controller performs the housekeeping functions for the cache unit, and includes the replacement algorithms for transferring data between the cache, CPU, and main memory.

The tag buffers store tag words which include address bits and status bits. One of the status bits of the tag buffer is known as the "valid" bit. The valid bit is HIGH when the data within the data buffer represents the true data in the main memory, and the valid data is LOW when the data within the data buffer does not represent the true data in the main memory.

The valid bits in the tag buffer must be reset to LOW upon system start-up, or when the tag buffer has been assigned to a different cache block in a multi-processing application. In the prior art, this was accomplished by writing into each word of the tag buffer. For example, if a tag buffer has 512 words, the prior art method for resetting the valid bit was to write into the tag buffer 512 times. Such a time consuming operation obviously degrades the overall efficiency of the computer system.

SUMMARY OF THE INVENTION

An object of this invention is to provide digital memory having storage cells which can be quickly preset or reset.

Another object of this invention is to provide digital memory which can be quickly and easily tested.

Briefly, the invention includes a plurality of memory cells arranged into a matrix of rows and columns, a row activation circuit for concurrently activating all of the rows, and a column activating circuit for concurrently resetting or presetting each of the columns of memory cells.

Each row is provided with the standard upper word line and lower word line, and each column is provided with the standard pair of bit lines. However, unlike prior art digital memory devices, each column of the present invention is also provided with a column reset line and a column preset line.

Each memory cell is coupled to the upper word line and the lower wording of the row of which it forms a part. Furthermore, each memory cell is coupled to the two bit lines, the reset line, and the preset line of the column of which it forms a part. Since, during reset or preset, all of the rows and all of the columns are activated concurrently, all of the memory cells can be reset or preset in a single memory cycle.

The present invention further teaches reset/preset logic coupled to the reset lines and the preset lines so that a particular column can be selectively reset or preset. This feature is particularly useful for test purposes. For example, all of the memory cells can be reset and then sequentially read to determine whether the matrix contains all zeros, and then all of the memory cells can be preset and sequentially read to determine if the matrix contains all ones.

As is apparent from the foregoing discussion, a major advantage of this invention is that the entire matrix of memory cells can be reset or preset substantially simultaneously which can greatly improve the performance of the systems in which the memory device is used.

Another advantage of this invention is that the digital memory can be quickly tested during the production process or in the field. The rapid testing feature of the present invention can therefore lower production costs and repair costs for the memory devices.

Other objects, features and advantages of the present invention will become apparent upon consideration of the following detailed description and the accompanying drawings, in which like reference designations represent like features throughout the figures.

DETAILED DESCRIPTION OF THE INVENTION

Reference is made now in detail to a specific embodiment of the present invention, which illustrates the best mode presently contemplated by the inventor for practicing the invention. Alternative embodiments are also briefly described as applicable.

Figure 1:
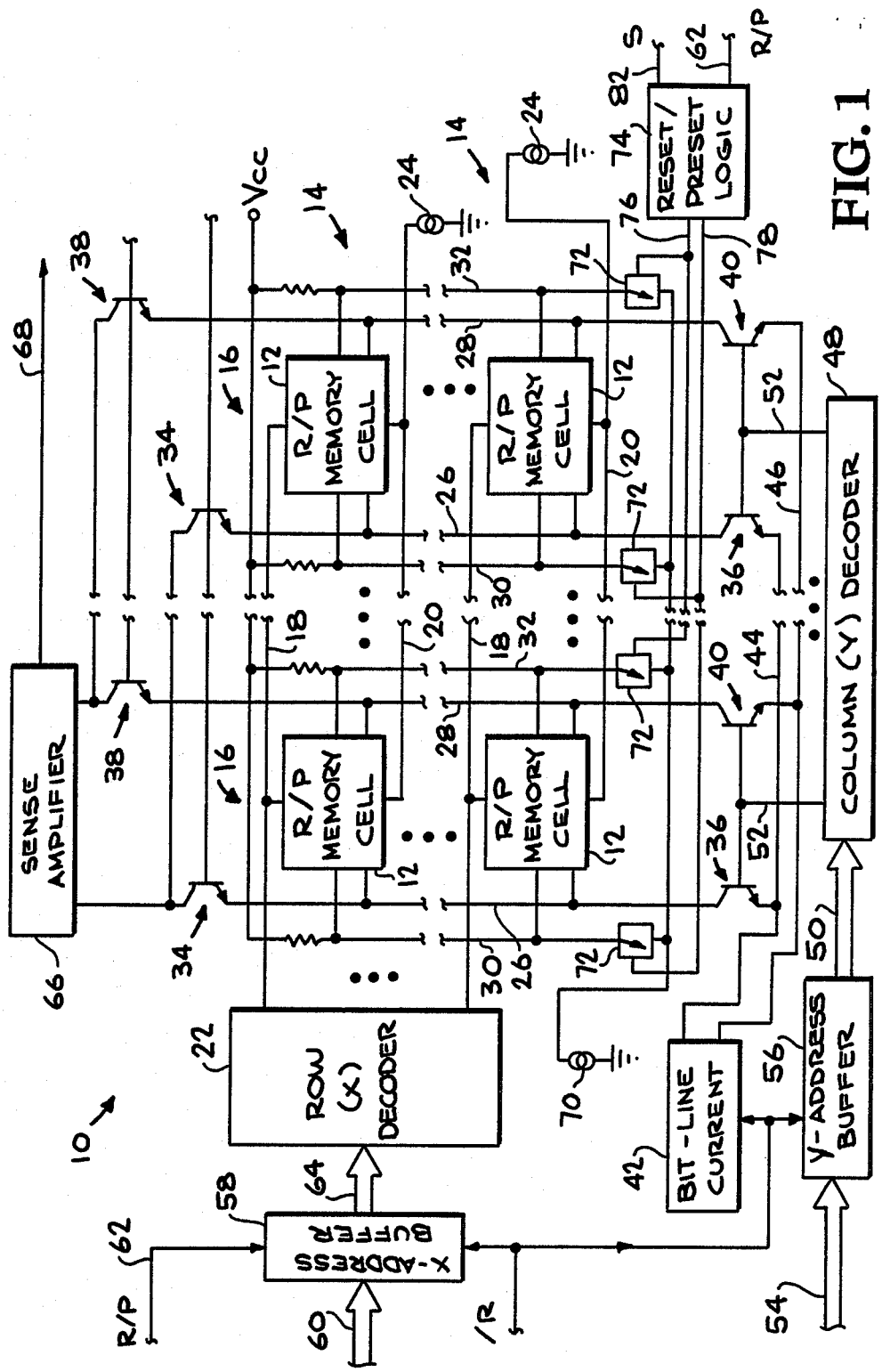
FIG. 1 is a block diagram view of a portion of a digital memory embodying the present invention.

With reference to FIG. 1, a portion of a digital memory 10 includes a plurality of memory cells 12 formed into a matrix having rows 14 and columns 16. With terminology taken from the Cartesian system, the rows are often referred to as "X" coordinates, and the columns 16 are often referred to as "Y" coordinates.

Each of the rows 14 of memory cells 12 include an upper word line 18 and a lower word line 20. The upper word line 18 is coupled to a row or X-decoder 22, and the lower word line 20 is coupled to a constant current source 24.

Each column 16 of memory cells 12 is associated with a first bit line 26, a second bit line 28, a reset line 30, and a preset line 32. The first bit line 26 is coupled to a first sensing transistor 34 at an upper end, and is coupled to a first switching transistor 36 at a lower end. Similarly, second bit line 28 is coupled to a second sensing transistor 38 at an upper end, and to a second switching transistor 40 at its lower end. Of course, the terms "upper end" and "lower end" refer to positions in the block diagram and schematic, and do not refer to any physical position or direction in the memory device itself.

A bit line current source 42 provides bit line currents on lines 44 and 46. The lines 44 and 46 are coupled to the emitters of first switching transistors 36 and second switching transistors 40, respectively. A column or Y-decoder 48 is responsive to a Y-address on a bus 50, and develops an output on column decode lines 52. The address on bus 50 is derived from an input address on a bus 54 after being processed in a Y-address buffer 56.

An X-address buffer 58 is responsive to an input X-address on a bus 60 and a reset/preset (R/P) signal on a line 62. The X-address buffer develops a buffered X-address on a bus 64. As will be discussed in greater detail subsequently, under normal operating conditions the X-decoder 22 will activate one of rows 14 at a time in response to a X-address on line 64 by energizing the appropriate upper word line 18. During a reset/preset operation, however, the X-address buffer 58 develops a signal on bus 64 which causes the X-decoder 22 to equalize the potentials on all of the rows 14 concurrently by simultaneously energizing all of the upper word lines 18.

A sense amplifier 66 is coupled to the collectors of first sensing transistors 34 and second sensing transistors 38. The output of sense amplifier 66 is developed on a line 68, and represents whether a zero or a one is stored within a selected memory cell. The operation of first sensing transistor 34, second sensing transistor 38, sense amplifier 66 is well known to those skilled in the art, and will not be discussed herein in any detail.

Reset line 30 and preset line 32 are coupled to a constant current source 70 by digital switches 72. The digital switches 72 are controlled by reset/preset logic 74 via lines 76 and 78. In this preferred embodiment, all of the digital switches 72 of preset lines 32 are controlled by signals on line 76, and all of the digital switches 72 of reset lines 30 are controlled by signals on line 78.

Reset/preset logic 74 is responsive to a selection (S) signal on a line 82, and to the R/P signal on line 62. When the R/P signal on line 62 is activated, reset/preset logic 74 energizes either line 76 or 78 in response to the S signal on line 82. In other words, either all of the reset lines 30 are coupled to constant current source 70, or all of the preset lines 32 are coupled to the constant current source 70, or neither the reset lines 30 nor the preset lines 32 are coupled to the constant current source.

The digital memory 10 operates in three basic modes, namely the read mode, the write mode, and the reset/preset mode. The read mode and the write mode are well known to those skilled in the art and, therefore, will not be discussed here in any detail.

In the reset/preset mode, an R/P signal is developed on line 62, and a S signal is developed on line 82. X-address buffer 58 causes X decoder 22 to activate all of the upper word lines 18, and reset/preset logic is caused to activate either all of the reset lines 30 or all of the preset lines 32. In this manner, all of the memory cells 12 are either concurrently reset to zero or preset to one.

The digital memory 10 can be tested when in the reset/preset mode by first resetting all of the memory cells 12, and then reading all the cells to see if a zero is, indeed, stored within them. Next, all of the memory cells 12 can be preset and then read to determine whether all of the memory cells contain a one. If any one of the memory cells 12 cannot be reset and preset properly the digital memory is defective.

It should also be noted that reset/preset logic can also be provided which individually resets or presets a particular column. By way of examples, reset/preset logic can be provided which resets only one column of the matrix, or reset/preset logic could be provided which resets certain columns of the matrix and presets the remaining columns.

It is also important to note that the reset/preset logic 74 of the present invention could be eliminated, and the switches 72 could either be programmed or made part of the digital memory circuit 10. For example, the switches 72 could be fuse programmable by techniques well known to those skilled in the art. Alternatively, the switches 72 could be implemented by switching transistors or by providing or not providing a metal conductive path between the preset line 30, the reset line 32, and the constant current source 70.

Figure 2:
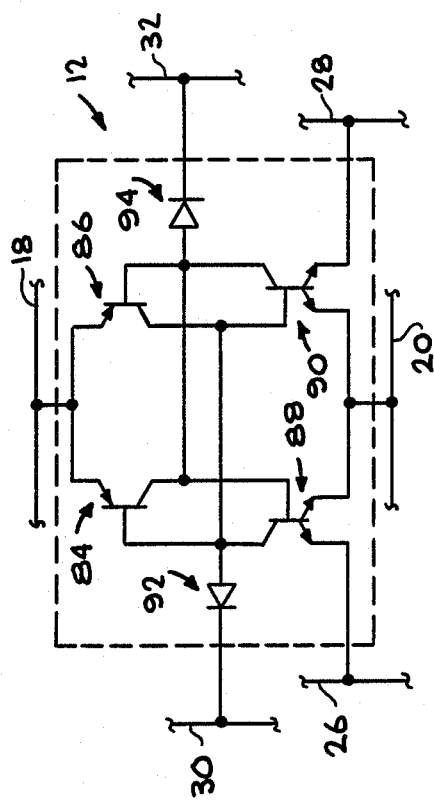
FIG. 2 is a schematic of a preferred exbodiment of a reset/preset memory cell shown in FIG. 1.

Referring now to FIG. 2, a memory cell 12 includes a first transistor 84, a second transistor 86, a third transistor 88, and a fourth transistor 90. Memory cell 12 also includes a reset diode 92, and a preset diode 94.

With the exception of the reset diode 92 and the preset diode 94, the circuitry of memory cell 12 is known. The emitters of transistors 84 and 86 are coupled to upper word line 18, while standby emitters of transistors 88 and 90 are coupled to lower word lines 20. Bit emitters of transistors 88 and 90 are coupled to bit lines 26 and 28, respectively.

The anode of diode 92 is coupled to the bases of transistors 84 and 90, and to the collectors of transistors 86 and 88, and the cathode of diode 92 is coupled to reset line 30. In a similar fashion, the anode of diode 94 is coupled to the bases of transistors 86 and 88 and to the collectors of transistors 84 and 90 and the cathode of diode 94 is coupled to preset line 32.

As discussed previously, when in the reset/preset mode, either reset line 30 or preset line 32 is coupled to constant current source 70. If, for example, reset line 30 is selected, the constant current source 70 will draw current through diode 92 to very quickly reset the memory cell 12. If, on the other hand, preset line 32 is selected, the constant current source 70 will draw current through diode 94 to very quickly preset the memory cell 12.

Figure 3:
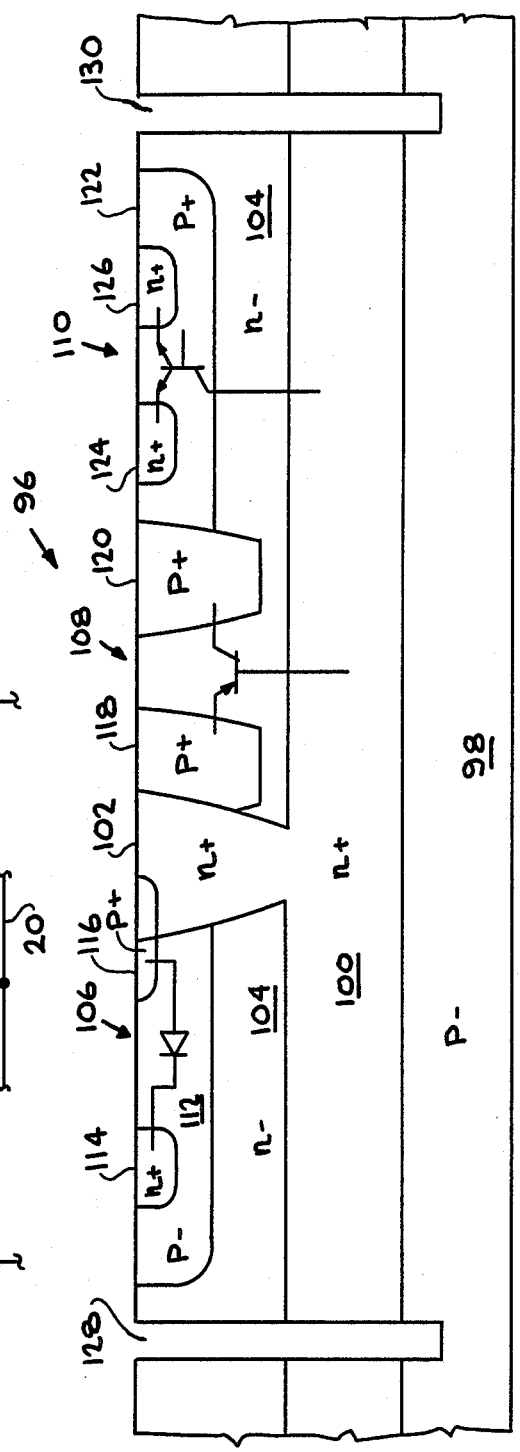
FIG. 3 is a cross-section of a portion of an integrated circuit memory cell having reset/preset capabilities.

A practical reset/preset memory cell for an integrated circuit device will be discussed with reference to FIG. 3. It should be noted that FIG. 3 shows exemplary semiconductor layers of the device, and does not include the connection and insulation layers which are formed on top of the semiconductor layers to interconnect the various devices formed therein. The connection and insulation layers are of conventional design and utilize conventional technologies in their manufacture. The actual configuration of the connection and insulation layers would be obvious to those skilled in the art of integrated circuit design upon a study of the schematic of FIG. 2 and the cross-section of FIG. 3, and therefore will not be discussed here in any detail.

In FIG. 3, a section 96 of an integrated circuit device includes a substrate 98 of a first conductivity type, such as P type material P−. Formed over substrate 98 is a high conductivity layer 100 of a second conductivity type, such N type material N+. The operator "−" is used to denote a relatively lightly doped material, while the operator "+" is used to denote a relatively heavily doped material.

High conductivity layer 100 includes a riser portion 102 which is used as a pick-up point for coupling the high conductivity layer 100 to other devices of the integrated circuit device. An intermediate layer 104 of N− material is formed over the high conductivity layer 100, and is bifurcated by the riser portion 102.

A diode 106 is formed into the intermediate layer 104 on a first side of the riser portion 102; and first and second transistors 108 and 110, respectively, are formed into the intermediate layer 104 on a second side of riser portion 102. First transistor 108 is configured as a bipolar PNP transistor, while second transistor 110 is configured as a bipolar, dual-emitter NPN transistor.

Diode 106 includes a diode well 112 of P−material. A first diode region 114 of N+ material and a second diode region 116 of P+ material are formed into the diode well 112. The second diode region 116 is in intimate contact with high conductivity layer 100 via riser portion 102.

First transistor 108 includes a first region 118 and a second region 120, both of P+ material and both formed into intermediate layer 104. First region 118 is in intimate contact with high conductivity layer 100 via riser portion 102.

Second transistor 110 includes a transistor well 122 of P+ material; and third and fourth regions 124 and 126, respectively, of N+ material formed into transistor well 122. The transistor well 122 is in intimate contact with second region 120 of first transistor 108.

The section 96 of FIG. 3, which is bounded by isolation channels 128 and 130, corresponds to one-half of the memory cell 12 shown in FIG. 2. More specifically, diode 106 corresponds to reset diode 92, first transistor 108 corresponds to first transistor 84, and second transistor 110 corresponds to third transistor 88. The other half of the memory cell 12, i.e. the half including preset diode 94, second transistor 86, and fourth transistor 90, can be formed in the integrated circuit device as the mirror image of the section 96. In other words, since the two halves of the memory cell 12 are symmetrical, the description of section 96 effectively describes both halves.

It should be noted that many publications describe the details of common techniques used in the fabrication process of integrated circuit components. See, for example, *Semiconductor and Integrated Circuit Fabriction Techniques*, Reston Publishing Company, Inc., (c) copyright 1979 Fairchild Corporation. These techniques can be generally employed in the fabrication of the structure of the present invention. Moreover, the individual steps of such a process can be performed using commercially available integrated circuit fabrication machines. As specifically necessary to an understanding of the present invention, approximate technical data for the preferred embodiment is set forth based upon current technology. Future developments in this art may call for appropriate adjustments as would be obvious to one skilled in the art.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in many fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. An integrated circuit device for forming a memory cell having two half cells. each of said half cells comprising:

a substrate having a first conductivity type;

a high conductivity layer formed over said substrate and having a second conductivity type:

an intermediate layer formed over said high conductivity layer and having said second conductivity type;

said intermediate layer being bifurcated so as to form a first intermediate layer a second intermediate layer, and a riser portion disposed therebetween, said riser portion having said second conductivity type and extending into said high conductivity layer;

a diode well region of said conductivity type being formed into said first intermediate layer;

a cathode region of said second conductivity type and an anode region of said first conductivity type being both formed into said diode well region so as to form a diode, said anode region being in contact with said riser portion;

an emitter region of said first conductivity type and a collector region of said first conductivity type being both formed into said second intermediate layer so as to form a first transistor, said second intermediate layer serving as a base region of said first transistor, said emitter region of said first transistor being in contact with said riser portion;

a transistor well region of said first conductivity type being formed into said second intermediate layer adjacent said collector region of said first transistor; and two additional emitter regions of said second conductivity type being both formed into said transistor well region so as to form a second transistor, said transistor well region serving as a base region of said second transistor and said second intermediate layer serving as a collector of said second transistor.

* * * * *